US010683433B2

(12) United States Patent
Uprety et al.

(10) Patent No.: US 10,683,433 B2
(45) Date of Patent: Jun. 16, 2020

(54) PROTECTIVE COATING SYSTEM FOR PLASTIC SUBSTRATE

(71) Applicant: PPG INDUSTRIES OHIO, INC., Cleveland, OH (US)

(72) Inventors: Krishna K. Uprety, Valencia, CA (US); Alexander Bimanand, Burbank, CA (US); Khushroo H. Lakdawala, Santa Clarita, CA (US); Harry Buhay, Yardley, PA (US)

(73) Assignee: PPG INDUSTRIES OHIO, INC., Cleveland, OH (US)

( * ) Notice: Subject to any disclaimer, the term of this patent is extended or adjusted under 35 U.S.C. 154(b) by 522 days.

(21) Appl. No.: 14/925,916

(22) Filed: Oct. 28, 2015

(65) Prior Publication Data
US 2016/0122573 A1 May 5, 2016

Related U.S. Application Data

(60) Provisional application No. 62/072,241, filed on Oct. 29, 2014.

(51) Int. Cl.
*C09D 133/08* (2006.01)
*C09D 183/04* (2006.01)
(Continued)

(52) U.S. Cl.
CPC ............ *C09D 133/08* (2013.01); *B32B 7/022* (2019.01); *C08J 7/0423* (2020.01); *C09D 175/04* (2013.01);
(Continued)

(58) Field of Classification Search
CPC .... C09D 133/00–26; C09D 183/00–16; C09D 163/00–10; C23C 16/00–56; G02B 1/00–18; Y10T 428/00–8305
See application file for complete search history.

(56) References Cited

U.S. PATENT DOCUMENTS 4,615,947 A * 10/1986 Goossens ............. C09D 133/06
428/412
5,462,806 A * 10/1995 Konishi ................. G02B 1/105
428/204
(Continued)

OTHER PUBLICATIONS

"A Guide to Silane Solutions from Dow Corning". Dow Corning, (2005); pp. 1-29.*
(Continued)

*Primary Examiner* — Prashant J Khatri
(74) *Attorney, Agent, or Firm* — Lewis Roca Rothgerber Christie LLP

(57) ABSTRACT

A coated substrate includes: a substrate and a first layer on at least a portion of the substrate, the first layer including a polymer selected from the group consisting of an acrylic, an epoxy, a polyurethane, a copolymer thereof, and a mixture thereof, and an additive selected from the group consisting of an ultraviolet light (UV) absorber, a UV stabilizer, and a mixture thereof. The coated substrate further includes a second layer on at least a portion of the first layer, and a third layer on at least a portion of the second layer. A method of forming a coated substrate includes: forming a first layer on at least a portion of a substrate; forming a second layer on at least portion of the first layer; and forming a third layer by plasma enhanced chemical vapor deposition on at least a portion of the second layer.

14 Claims, 7 Drawing Sheets

(51) Int. Cl.
*C23C 16/30* (2006.01)
*C08J 7/04* (2020.01)
*B32B 7/022* (2019.01)
*C09D 175/04* (2006.01)
*C08K 5/00* (2006.01)
*C08K 3/014* (2018.01)
*B05D 3/12* (2006.01)
*B05D 7/02* (2006.01)
*B05D 1/00* (2006.01)
*B05D 7/00* (2006.01)

(52) U.S. Cl.
CPC ............ *C09D 183/04* (2013.01); *C23C 16/30* (2013.01); *B05D 1/62* (2013.01); *B05D 3/12* (2013.01); *B05D 7/02* (2013.01); *B05D 7/576* (2013.01); *B05D 2425/01* (2013.01); *B05D 2451/00* (2013.01); *C08J 2369/00* (2013.01); *C08J 2433/08* (2013.01); *C08J 2483/04* (2013.01); *C08K 3/014* (2018.01); *C08K 5/005* (2013.01)

(56) References Cited

U.S. PATENT DOCUMENTS

| | | | |
|---|---|---|---|
| 5,508,368 A * | 4/1996 | Knapp | C23C 16/0245 347/203 |
| 5,846,649 A | 12/1998 | Knapp et al. | |
| 2004/0207809 A1* | 10/2004 | Blackburn | C08K 5/0008 351/159.01 |
| 2007/0166562 A1 | 7/2007 | Swei et al. | |
| 2010/0239742 A1 | 9/2010 | Larson-Smith et al. | |
| 2011/0058142 A1* | 3/2011 | Berit-Debat | G02B 1/105 351/159.57 |
| 2014/0162037 A1 | 6/2014 | Bowen et al. | |

OTHER PUBLICATIONS

"Tinuvin 292 Hindered Amine Light Stabilizer for Coatings". Ciba-Geigy Corporation, (1989); pp. 1-10.*
PCT Search Report and Written Opinion for International Application PCT/US2015/057904, dated Jan. 18, 2016; 14 Pages.

* cited by examiner

PROTECTIVE COATING SYSTEM FOR PLASTIC SUBSTRATE

CROSS-REFERENCE TO RELATED APPLICATION(S)

This application claims priority to and the benefit of U.S. Provisional Application Ser. No. 62/072,241, filed on Oct. 29, 2014, entitled "PROTECTIVE COATING SYSTEM FOR PLASTIC SUBSTRATE," the entire contents of which are fully incorporated herein by reference.

BACKGROUND

Transparent hard coatings, such as, for example, silicon oxycarbide, may have a glass like appearance and an abrasion resistance and weatherability that may be superior to many plastic (or polymer) substrates. Plasma enhanced chemical vapor deposition may be used to deposit the hard coating. When deposited directly on a bare plastic substrate, the adhesion of the hard coating to the substrate, and the optical properties of the coated substrate, may be limited. A base layer may be included between the substrate and the hard coating to improve the adhesion of the hard coating to the substrate and/or to improve the optics of the coated substrate.

SUMMARY

According to an embodiment of the present disclosure, a coated substrate includes a substrate and a first layer on at least a portion of the substrate, the first layer including: a polymer selected from the group consisting of an acrylic, an epoxy, a polyurethane, a copolymer thereof, and a mixture thereof, and an additive selected from the group consisting of an ultraviolet light (UV) absorber, a UV stabilizer, and a mixture thereof. The coated substrate further includes a second layer on at least a portion of the first layer, the second layer having a hardness higher than that of the first layer; and a third layer on at least a portion of the second layer, the third layer having a hardness higher than that of the second layer.

The first layer may include the UV absorber.
The first layer may include the UV stabilizer.
The coated substrate may further include an adhesion promoting coating between the first layer and the substrate.
The adhesion promoting coating between the first layer and the substrate may include a silane polymer and/or a silane coupling agent.
The coated substrate may further include an adhesion promoting coating between the first layer and the second layer.
The adhesion promoting coating between the first layer and the second layer may include a silane polymer and/or a silane coupling agent.
The second layer may include a polysiloxane polymer, a polyurethane polymer, an epoxy polymer, a copolymer thereof, or a mixture thereof.
The third layer may include a plasma enhanced chemical vapor deposited coating.
The third layer may include $SiO_xC_y$, where x is 0.1 to 1.2 and y is 0.1 to 1.2.
The second layer may have a thickness of 1 to 5 μm.
The third layer may have a thickness of 3 to 6 μm.
According to an embodiment, a coated substrate includes a substrate and a first layer on at least a portion of the substrate, the first layer including a polymer selected from the group consisting of an acrylic, an epoxy, a polyurethane, a copolymer thereof and a mixture thereof, and an additive selected from the group consisting of a UV absorber, a UV stabilizer, and a mixture thereof. The coated substrate further includes; a polysiloxane layer (e.g., a hard basecoat) on at least a portion of the first layer, the polysiloxane layer having a hardness higher than that of the first layer; and a third layer on at least a portion of the polysiloxane layer, the third layer having a hardness higher than that of the polysiloxane layer, and the third layer including $SiO_xC_y$, x being 0.1 to 1.2, and y being 0.1 to 1.2.

According to an embodiment a coated substrate includes a substrate; a first layer on at least a portion of the substrate, the first layer having a hardness of greater than 0 to 0.45 gigapascal (GPa); a second layer on at least a portion of the first layer, the second layer having a hardness of 0.45 to 0.75 GPa; and a third layer on at least a portion of the second layer, the third layer having a hardness of greater than or equal to 2.0 GPa.

The coated substrate may further include a first silane coating between the substrate and the first layer, and a second silane coating between the first layer and the polysiloxane layer.

According to an embodiment of the present disclosure, a method of forming a coating on a substrate includes forming a first layer on at least a portion of the substrate, the first layer including a polymer selected from the group consisting of an acrylic, an epoxy, a polyurethane, a copolymer thereof, and a mixture thereof, and an additive selected from the group consisting of a UV absorber, a UV stabilizer, and a mixture thereof. The method further includes forming a second layer on at least portion of the first layer, the second layer having a hardness higher than that of the first layer; and forming a third layer by plasma enhanced chemical vapor deposition on at least a portion of the second layer, the third layer having a hardness higher than that of the second layer.

The first layer may include the UV absorber.
The first layer may include the UV stabilizer.
The method may further include forming an adhesion promoting coating on at least a portion of the substrate, and the forming of the first layer may include forming the first layer on at least a portion of the adhesion promoting coating.
The adhesion promoting coating between the substrate and the first layer may include a silane polymer and/or a silane coupling agent.
The method may further include forming an adhesion promoting coating on at least a portion of the first layer, and the forming of the second layer may include forming the second layer on at least a portion of the adhesion promoting coating.
The adhesion promoting coating between the first layer and the second layer may include a silane polymer and/or a silane coupling agent.
The forming of the third layer may include depositing the third layer by plasma enhanced chemical vapor deposition.

BRIEF DESCRIPTION OF THE DRAWINGS

The accompanying drawings, together with the specification, illustrate embodiments of the present disclosure, and, together with the description, serve to explain principles of the present disclosure.

DETAILED DESCRIPTION

In the following detailed description, only certain embodiments are shown and described, by way of illustration. As those skilled in the art would recognize, the subject matter disclosed herein may be embodied in many different forms and should not be construed as being limited to the embodiments set forth herein. In the context of the present application, when a first element is referred to as being "on" a second element, it may be directly on the second element or be indirectly on the second element with one or more intervening elements therebetween. Also, "on" may mean "below," depending upon the point of view.

Embodiments of the present disclosure are generally directed toward a coated substrate having good weatherability (e.g., ultraviolet light (UV) resistance) and durability. The coated substrate includes a substrate, a first layer (e.g., a soft layer or tiecoat) on at least a portion of the substrate, and a third layer (e.g., a hard coating) on at least a portion of the first layer. The third layer has a hardness higher than that of the first layer (e.g., the third layer may be harder than the first layer). The third layer (e.g., the hard coating) may be used as a protective outboard coating on, for example, a transparency of a structure (e.g., a building) or vehicle, for example, a flying or ground vehicle (e.g., an aircraft canopy, windshield, or window), but the present disclosure is not limited thereto.

The coated substrate further includes a second layer (e.g., a hard basecoat) between the first layer and the third layer (e.g., the hard coating). The second layer has a hardness higher than that of the first layer (e.g., the second layer may be harder than the first layer). The first layer (e.g., the soft layer) has a relatively lower hardness, as compared to the second layer, suitable for accommodating (or reducing) the stresses experienced by the third layer (e.g., the hard coating) as a result of movement of the substrate and/or shrinkage of the second layer (e.g., the hard basecoat) during the curing process. For example, the hardness of the first layer may be greater than 0 (or 0.1) to 0.45 gigapascal (GPa) (e.g., greater than 0 to less than 0.45 GPa), greater than or equal to 0.1 to less than or equal to 0.4 GPa, greater than or equal to 0.1 to less than or equal to 0.35 GPa, greater than or equal to 0.1 to less than or equal to 0.3 GPa, greater than or equal to 0.15 to less than or equal to 0.45 GPa, greater than or equal to 0.2 to less than or equal to 0.45 GPa, greater than or equal to 0.25 to less than or equal to 0.45 GPa, greater than or equal to 0.25 to less than or equal to 0.3 GPa, or 0.29 GPa, as measured using the indentation method described herein. The present disclosure, however, is not limited thereto.

Figure 1:
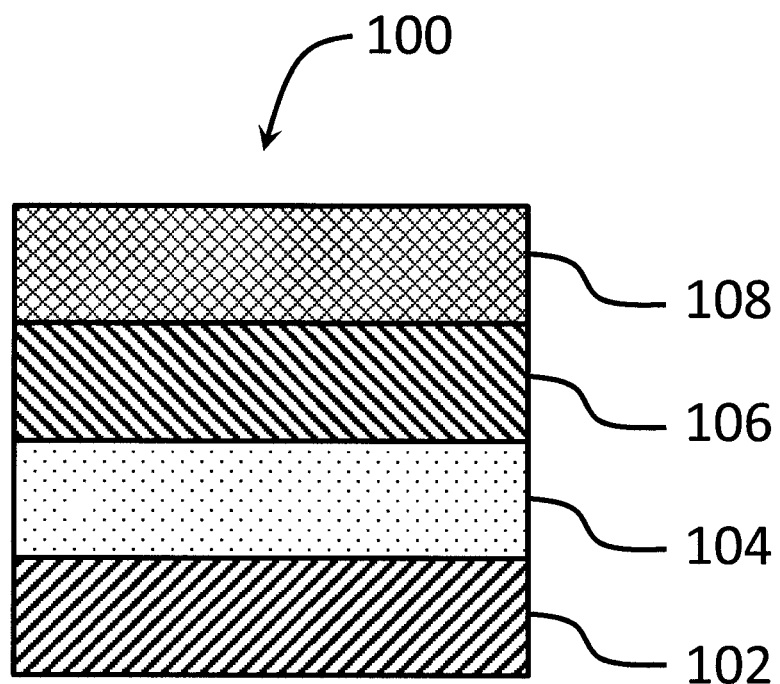
FIG. 1 is a schematic cross-sectional view of a coated substrate according to an embodiment of the present disclosure.

As an example, in the embodiment shown in FIG. 1, a coated substrate 100 includes a substrate 102 and a first layer 104 (e.g., a soft layer) on at least a portion of the substrate 102. The coated substrate further includes a second layer 106 (e.g., a hard basecoat) on at least a portion of the first layer 104, the second layer 106 being harder than the first layer 104, and a third layer 108 (e.g., a hard coating, such as an outboard protective hard coating) on at least a portion of the second layer 106 (e.g., the hard basecoat), the third layer 108 being harder than the second layer 106. The second layer 106 (e.g., the hard basecoat) improves the adhesion of the third layer 108 (e.g., the hard coating) to the first layer 104 (e.g., the soft layer) and may be formed prior to the formation of the third layer 108 (e.g., the hard coating).

The first layer (e.g., the soft layer) may be configured to have UV resistance suitable for improving the weatherability of the substrate. The first layer (e.g., the soft layer) may also be configured to have flexibility and softness suitable for improving the weatherability and durability (e.g., lifetime) of the third layer (e.g., the hard coating). The soft and flexible first layer (e.g., the soft layer or tiecoat) may at least partially absorb impacts to the third layer (e.g., the hard coating), and may reduce cracking of the third layer upon exposure of the third layer (e.g., the hard coating) to impact and/or flexing forces. By having the first layer (e.g., the soft layer) between the third layer (e.g., the hard coating) and the substrate, a likelihood or amount of cracking or degradation of the third layer (e.g., the hard coating) is reduced, thereby improving the weatherability and durability (e.g., lifetime) of the hard coating.

The second layer (e.g., the hard basecoat) has a relatively higher hardness, as compared to the first layer, suitable for supporting the growth or formation of the third layer (e.g., the hard coating). For example, the hardness of the second layer may be greater than 0.45 GPa (e.g., greater than 0.45 to less than or equal to 0.75 GPa), greater than or equal to 0.45 to less than or equal to 0.7 GPa, greater than or equal to 0.45 to less than or equal to 0.65 GPa, greater than or equal to 0.45 to less than or equal to 0.6 GPa, greater than or equal to 0.5 to less than or equal to 0.75 GPa, greater than or equal to 0.55 to less than or equal to 0.75 GPa, greater than or equal to 0.6 to less than or equal to 0.75 GPa, greater than or equal to 0.55 to less than or equal to 0.65 GPa, or 0.6 GPa, as measured using the indentation method described herein. The present disclosure, however, is not limited thereto. If the hardness of the second layer is too low, the third layer (e.g., the hard coating) may experience crazing or flaking.

In some embodiments, the coated substrate includes a stack including a substrate (e.g., a polycarbonate substrate), a first layer (e.g., a soft layer, such as an acrylic layer, a polyurethane layer, an epoxy layer, or combination thereof) on the substrate, a second layer (e.g., a hard basecoat, such as a polysiloxane layer, an acrylic layer, a polyurethane layer, an epoxy layer, or a combination thereof) on the first layer, and a third layer (e.g., a hard coating, such as a PECVD hard coating) on the second layer. In some embodiments, the third layer has a higher hardness (e.g., is harder) than the first layer and the second layer. The second layer has a higher hardness (e.g., is harder) than the first layer. The third layer (e.g., the hard coating) provides the coated substrate with a durable, abrasion resistant outer layer having good weatherability, and the third layer (e.g., the hard coating) protects the substrate from degradation. Improving the durability of the third layer (e.g., the hard coating) improves the durability of the coated substrate. The third layer may have a hardness greater than or equal to 2.0 GPa. For example, the third layer may have a hardness of greater than or equal to 2.0 to less than or equal to 4.5 GPa, greater than or equal to 2.5 to less than or equal to 4.5 GPa, greater than or equal to 2.5 to less than or equal to 4.0 GPa, greater than or equal to 2.5 to less than or equal to 3.5 GPa, greater than or equal to 2.5 to 3.0 GPa, greater than or equal to 2.7 to 3.1 GPa, or 3 GPa.

In some embodiments, the first layer (e.g., the soft layer) includes a polymer including an acrylic, an epoxy, a polyurethane, a copolymer thereof, or a mixture thereof. The acrylic may include any suitable acrylate polymer (or acrylic polymer) available for coatings. Non-limiting examples of the acrylic include polyacrylates, polymethacrylates, polymethyl methacrylates, polycyanoacrylates, and the like. The acrylic may be formed from any suitable monomer available for coatings, such as acrylate monomers. Non-limiting examples of the acrylate monomer include acrylates, methacrylates, methyl methacrylates, cyanoacrylates, and the like. The epoxy may include any suitable polymer formed from an epoxy resin (e.g., a polyepoxide) and a co-reactant including a reactive functional group (e.g., amines, acids, acid anhydrides, phenols, alcohols and thiols). Non-limiting examples of the epoxy resin include EPON 826, EPON 828, EPON 872, EPON 1001F, EPON 1007F, and EPON 1009F (each of which is available from Momentive Specialty Chemicals Inc.); ARALDITE 7071, ARALDITE 7074, ARALDITE 7004, ARALDITE GT 6063, ARALDITE GT 6084-2, and ARALDITE GY 281 (each of which is available from Huntsman Advanced Materials); and D.E.R. 317, D.E.R. 331, D.E.R. 329, D.E.R. 351, and D.E.R. 750 (each of which is available from The Dow Chemical Company). Non-limiting examples of the co-reactant including the reactive functional group include polyamines (e.g., EPI-KURE 3300 and EPIKURE 3387, each of which is available from Momentive Specialty Chemicals Inc.; ARADUR 21, ARADUR 42, and ARADUR 1012, each of which is available from Huntsman Advanced Materials; and D.E.H. 262, D.E.H. 2300, D.E.H. 3531, and D.E.H. 4042, each of which is available from The Dow Chemical Company), polyamidoamines (e.g., ARADUR 283, ARADUR 115, ARADUR 125, D.E.H. 1911 and D.E.H. 1450, each of which is available from The Dow Chemical Company).

The first layer (e.g., the soft layer) may include any suitable polyurethane. For example, the polyurethane of the first layer (e.g., the soft layer) may include a reaction product of a difunctional polyol (e.g., an oligomeric or polymeric polyol having two hydroxyl groups) and an isocyanate (e.g., a difunctional isocyanate having 2 isocyanate groups, or a multifunctional isocyanate having 3 or more isocyanate groups). In some embodiments, the isocyanate includes an aliphatic polyisocyanate having 2 or more isocyanate groups. Non-limiting examples of suitable isocyanates include bis(4-isocyanatocyclohexyl)methane (e.g., DESMODUR® W), 1,6-hexamethylene diisocyanate (HDI) biuret (e.g., DESMODUR® N-75), high functional HDI trimer (e.g., DESMODUR® N-3790), each available from Bayer MaterialScience (Leverkusen, Germany). Non-limiting examples of suitable polymeric polyols include polyester polyols, acrylic polyols, polyether polyols, polycarbonate polyols, and the like. Non-limiting examples of suitable polyester polyols (e.g., polyester polyols based on caprolactone chemistry) include CAPA 2085, CAPA 2100, CAPA 2125, CAPA 2200, CAPA 2201, and CAPA 1301, each available from Perstop Group, Sweden. A non-limiting example of a suitable acrylic polyol includes PARALOID AU-608, available from the Dow Chemical Company, Midland, Mich. A non-limiting example of a suitable polyether polyol includes polytetramethylene oxide diol (e.g., Terathane 1000, available from E. I. duPont de Nemours & Co., Wilmington, Del.). Non-limiting examples of suitable polycarbonate polyols include PACAPOL L500, and QUICKSTAR 850K, each available Instrumental Polymer Technologies, Westlake Village, Calif.

The first layer (e.g., the soft layer) may have a thickness of 1 to 5 μm. For example, the first layer (e.g., the soft layer) may have a thickness of 2 to 5 μm, or, for example, 3 μm. In some embodiments, the first layer (e.g., the soft layer) includes an acrylic coating having a thickness of 2 to 5 μm on a polycarbonate substrate. By having a thickness within any of the foregoing ranges, the first layer (e.g., the soft layer) may have suitable flexibility to provide the third layer (e.g., the hard coating) and/or the coated substrate with good weatherability and durability.

The first layer (e.g., the soft layer) further includes an additive including a UV absorber, a UV stabilizer, or a mixture thereof. In some embodiments, the first layer includes the UV absorber and, optionally, further includes the UV stabilizer. The UV stabilizer and/or UV absorber may be configured to protect the coated substrate from degradation induced by UV radiation. The UV absorber is configured to absorb UV and to reduce degradation of the substrate and/or the first layer (e.g., the soft layer) that would otherwise result from UV exposure. For example, the UV absorber improves the resistance of the coated substrate to degradation and/or yellowing. The UV absorber may include any suitable UV absorber available for coatings. The UV absorber may be included in any suitable amount. For example, the UV absorber may be included in the first layer (e.g., the soft layer) in an amount of 1 wt % to 8 wt %, based on the total weight of the first layer (e.g., the soft layer). For example, the UV absorber may be included in an amount of 6 wt %, based on the total weight of the first layer (e.g., the soft layer). By including the UV absorber in an amount within any of the foregoing ranges, the first layer (e.g., the soft layer) may have suitable UV resistance to provide the coated substrate with good weatherability and durability.

Examples of UV absorbers are shown as Compositions 1-7 below, but the UV absorber is not limited thereto.

[Composition 1]
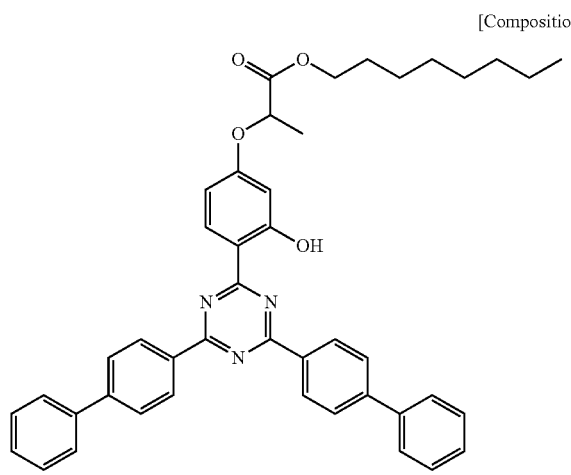
[Composition 2]
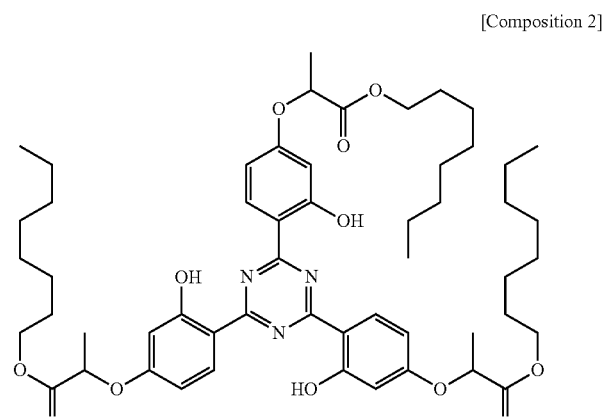
[Composition 3]
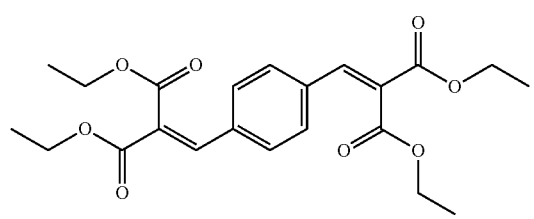
[Composition 4]
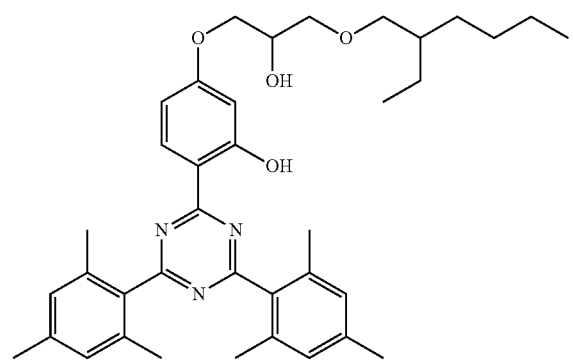
[Composition 5]
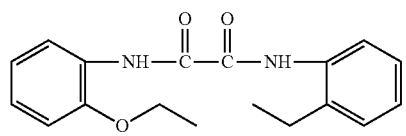
[Composition 6]
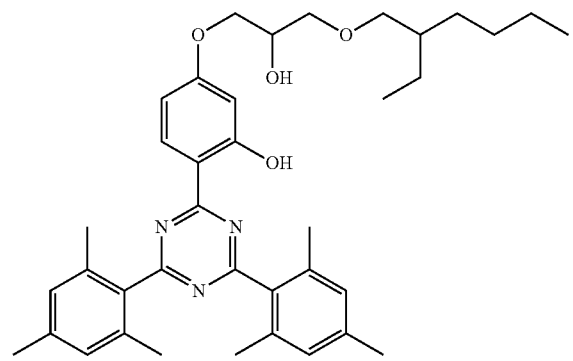
[Composition 7]
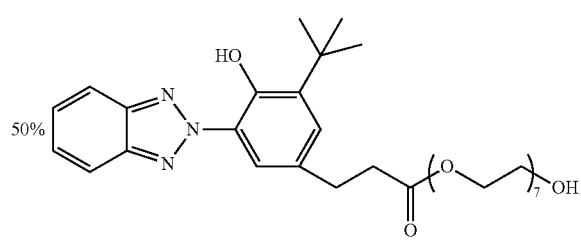
TINUVIN 1130

-continued

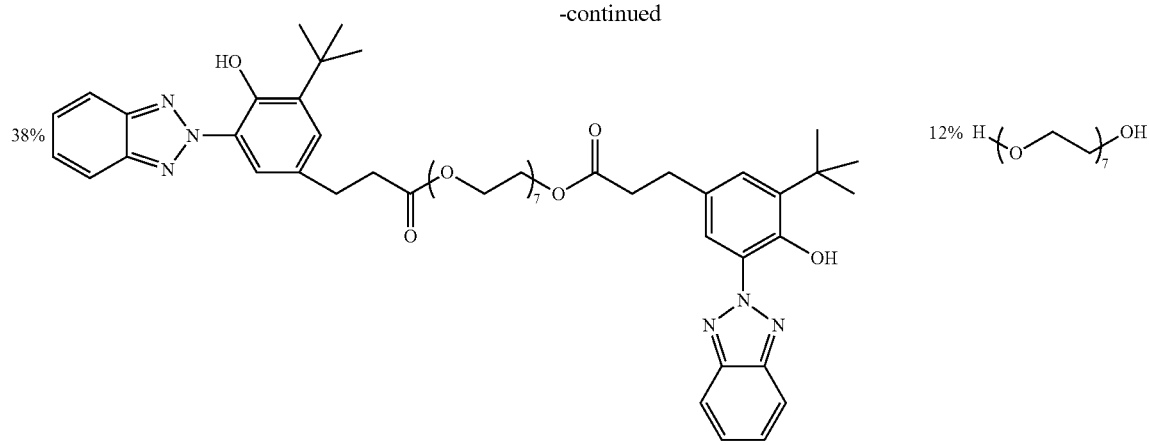

Non-limiting commercially available examples of UV absorbers include propanoic acid,2-[4-[4,6-bis([1,1'-biphenyl]-4-yl)-1,3,5-triazin-2-yl]-3-hydroxyphenoxy]-,isooctyl ester (e.g., TINUVIN® 479), β-[3-(2-H-benzotriazole-2-yl)-4-hydroxy-5-t-butylpheny l]-propionic acid-poly(ethylene glycol) 300 ester, bis {β-[3-(2-H-benzotriazole-2-yl)-4-hydroxy-5-t-butylphenyl]-propionic acid}-poly(ethylene glycol) 300 ester (e.g., TINUVIN® 1130), TINUVIN® 477 and 2-[4-[(2-hydroxy-3-(2'-ethyl)hexyl)oxy]-2-hydroxyphenyl]-4,6-bis(2,4-dimethylphenyl)-1,3,5-triazine (e.g., TINUVIN® 405) (each available from BASF Resins); and p-phenylenebis(methylenemalonic acid)tetraethyl ester (e.g., HOSTAVIN® B-CAP), 2-ethyl,2'-ehtoxy-oxalanilide (e.g., HOSTAVIN® VSU), and propanedioic acid,2-[(4-methoxyphenyl)methylene]-,1,3-dimethylester (e.g., HOSTAVIN® PR-25) (each available from Clariant International Ltd.). TINUVIN® is a registered trademark of Ciba Specialty Chemical Corporation. HOSTAVIN® is a registered trademark of Hoechst GMBH Corporation.

In some embodiments of the present disclosure, the first layer (e.g., the soft layer) includes a UV stabilizer. For example, in some embodiments, the first layer (e.g., the soft layer) includes both the UV stabilizer and the UV absorber, but the first layer (e.g., the soft layer) is not limited thereto. The UV stabilizer may include any suitable UV stabilizer available for coatings, such as any suitable free radical scavenger. The UV stabilizer is configured to scavenge free radicals that are formed as a result of UV exposure, and to thereby reduce degradation of the substrate and/or first layer (e.g., the soft layer) that would otherwise result from UV exposure. The UV stabilizer may be included in the first layer (e.g., the soft layer) in any suitable amount. For example, the UV stabilizer may be included in the first layer (e.g., the soft layer) in an amount of 1 to 10 wt %, 1 to 6 wt %, or 1 wt % to 5 wt %, based on the total weight of the first layer (e.g., the soft layer). For example, the UV stabilizer may be included in an amount of 1 to 3 wt %, based on the total weight of the first layer (e.g., the soft layer). By including the UV stabilizer in an amount within any of the foregoing ranges, the first layer (e.g., the soft layer) may have suitable UV resistance to provide the coated substrate with good weatherability and durability.

Non-limiting commercially available examples of the UV stabilizer include propanedioic acid [(4-methoxyphenyl)-methylene]-bis(1,2,2,6,6-pentamethyl-4-piperidinyl)ester (e.g., HOSTAVIN® PR-31 available from Clariant International Ltd.), Sanduvor 3055 (available from Clariant International Ltd.) and commercially available hindered aminoether light stabilizers such as TINUVIN® 123, TINUVIN® 292, TINUVIN® 326, TINUVIN® 328, TINUVIN® 765, TINUVIN® 900, TINUVIN® 900 and TINUVIN® 152 (each available from BASF Resins). Examples of UV stabilizers are shown as Compositions 8-17 below, but the UV stabilizer is not limited thereto.

[Composition 8]

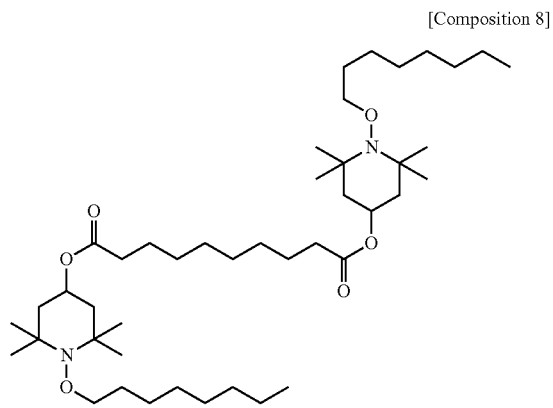

[Composition 9]

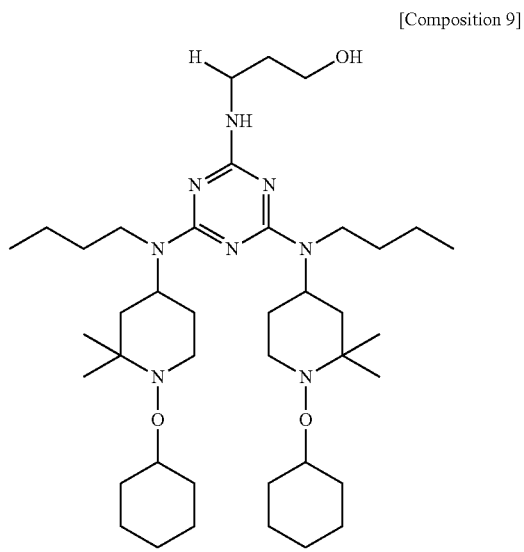

[Composition 10]

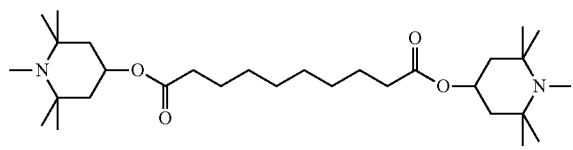

75%

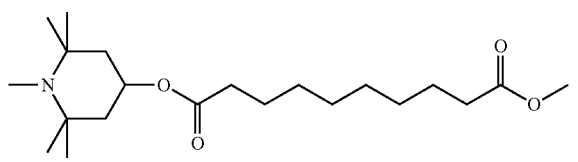

25%

[Composition 11]

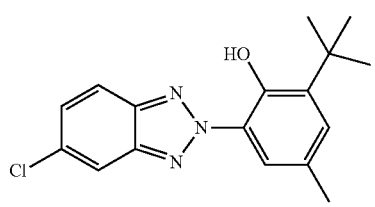

[Composition 12]

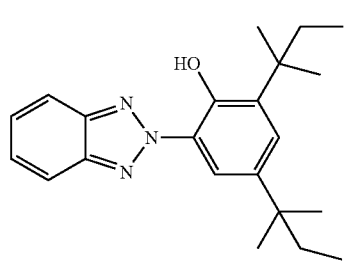

[Composition 13]

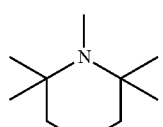

[Composition 14]

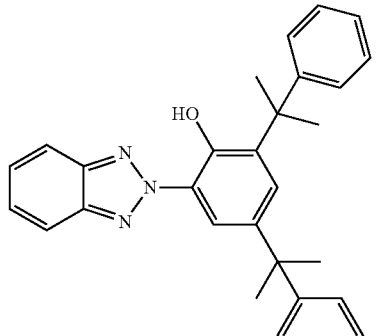

[Composition 15]

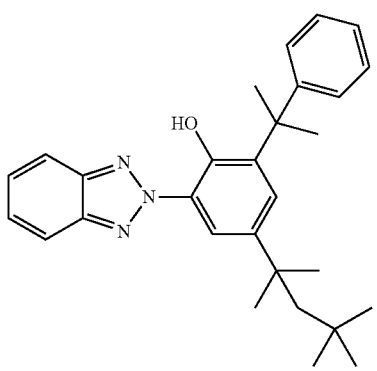

[Composition 16]

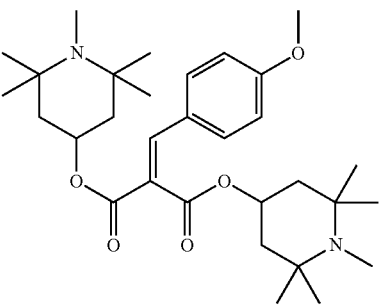

[Composition 17]

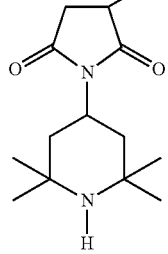

The third layer may be any suitable hard coating available for transparencies. The third layer (e.g., the hard coating) may include a silicon-based layer, a boron-based layer, an aluminum-based layer, a zirconium-based layer, a chromium-based layer, a tantalum-based layer, a titanium-based layer, diamond-like carbon, silicon-doped diamond-like carbon, and/or the like. For example, the third layer (e.g., the hard coating) may include silicon oxycarbide (e.g., $SiO_xC_y$, where x is 0.1 to 1.2 (or 1.0 to 1.2) and y is 0.1 to 1.2 (or 0.8 to 1.2)), hydrogen doped silicon oxycarbide, silicon nitride (e.g., Si$_3$N$_4$), boron carbide (e.g., B$_4$C), alumina (e.g., Al$_2$O$_3$), aluminum nitride (e.g., AlN), aluminum silicate, silicon carbide (e.g., SiC), fused silica, boron nitride (e.g., BN), zirconia, chromium carbide (e.g., Cr$_3$C$_2$), chromium boride (e.g., CrB$_2$), tantalum carbide, titanium nitride (e.g., TiN), titanium oxide (e.g., TiO$_2$), diamond like carbon (DLC), and/or the like. The third layer (e.g., the hard coating) may have a thickness of 1 to 6 μm, 1 to 5 μm, 3 to 6 μm, or, for example 4 to 5 μm, but the third layer (e.g., the hard coating) is not limited thereto. In some embodiments the hydrogenated silicon oxycarbide is represented by the general formula Si$_w$O$_x$C$_y$H$_z$, where w has a value of 10 to 33 atomic percent (e.g., 18 to 20 atomic percent), x has a value of 1 to 66 atomic percent (e.g., 18 to 21 atomic percent), y has a value of 1 to 66 atomic percent (e.g., 31 to 38 atomic percent), z has a value of 0.1 to 60 atomic percent (e.g., 25 to 32 atomic percent), and w+x+y+z=100 atomic percent.

The deposition of the third layer (e.g., the hard coating) may be carried out using any suitable process available in the art. For example, the third layer (e.g., the hard coating) may be deposited by an ion-assisted plasma process (e.g., plasma enhanced chemical vapor deposition). Prior to the application of the third layer (e.g., the hard coating), the surface to which the third layer (e.g., the hard coating) is applied may be cleaned using any suitable process available for the preparation of coatings.

In some embodiments, the third layer (e.g., the hard coating) is formed using the plasma enhanced chemical vapor deposition apparatus and processes of General Plasma Inc. (GPi, Tuscon, Ariz.), but the present disclosure is not limited thereto. For example, the third layer (e.g., the hard coating) may be formed using high target utilization sputtering (HITUS) and/or any of the processes described in *Silicon Nitride ARC Thin Films by New Plasma Enhanced Chemical Vapor Deposition Source Technology*, M. A. George, H. Chandra, P. Morse, J. Morris, and J. E. Madocks (available at www.generalplasma.com); J. Madocks, Applied Process Technologies, Inc., *New Magnetically Enhanced Source for High Rate PECVD*, International Conference on Coatings on Glass, 2002 Proceedings; and J. Madocks, P. Marcus, Applied Process Technologies, Inc., *Production of Atomic Oxygen for Reactive Deposition or Plasma Treatment Processes*, Association of Industrial Metalizers, Coaters and Laminators, Fall Technical Conference 2003, the entire content of each of which is incorporated herein by reference.

For example, the third layer (e.g., the hard coating) may be deposited using an apparatus including an ion source having a dual plasma beam source. The ion source may include a linear source (e.g., a linear alternating current (AC) source and a reactive PECVD module). The linear source may include a discharge cavity and a magnetron cathode configured to form a uniform high density electron source. A divergent magnetic field may confine electrons that leave the discharge cavity and the divergent magnetic field may form a hall current that flows the length of the source. A reactive gas for forming the third layer (e.g., the hard coating) may be provided at an aperture of the discharge cavity. The reactive gas may include any suitable precursor, such as any suitable silicon-containing material (e.g., silane (SiH$_4$), tetraethyl orthosilicate (TEOS), silacyclobutanes, alkylsilanes (e.g., trimethylsilane), siloxane, silane, and/or silazane), an oxygen providing gas (e.g., oxygen), hydrocarbon (e.g., methane, acetylene, cyclohexane, and the like), nitrogen, hydrogen, ammonia, and the like, or a mixture thereof, but the present disclosure is not limited thereto. The power source available from General Plasma Inc. (GPi, Tuscon, Ariz.) provides a dense plasma that allows for high deposition rates, a uniform (or substantially uniform) plasma that provides good uniformity of deposition, low impedance and low pressure discharge that reduce powder formation, and high flux and low energy ion bombardment that allow for deposition of dense, high quality films.

Examples of the silicon-containing material include, but are not limited to, silane, tetrafluorosilane, trifluoromethyl trifluorosilane, methylsilane, dimethylsilane, trimethylsilane, tetramethylsilane, disilanomethane, bis(methylsilano) methane, 1,2-disilanoethane, 1,2-bis(methylsilano)ethane, 2,2-disilanopropane, 1,3,5-trisilano-2,4,6-trimethylene, 1,3-dimethylsiloxane, 1,3-bis(silanomethylene)disiloxane, bis (1-methyldisiloxanyl)propane, 2,4,6,8-tetramethylcyclo-tetrasiloxane, 2,4,6,8,10-pentamethylcyclopentasiloxane, 1,3,5,7-tetrasilano-2,6-dioxy-4,8-dimethylene, tetrapropargylsilane, tetraethynylsilane, phenylsilanes, silacyclobutane (H$_2$SiC$_3$H$_6$) and derivatives thereof, such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane, 1,3-disilacyclobutane and derivatives thereof, such as 1,1, 3,3-tetrafluoro-1,3-disilacyclobutane, 1-methyl-1,3-disilacyclobutane, 1,3-dimethyl-1,3-disilacyclobutane, 1-ethylmethyl-1,3-disilacyclobutane, 1-butyl-1,3-disilacyclobutane, 2,4-dimethyl-1,3-disilacyclobutane, 2,2-diethyl-1,3-disilacyclobutane, and 2,4-ethylpropyl-1,3-disilacyclobutane. A combination or mixture of two or more silicon-containing materials can be employed to modify or improve properties such as dielectric constant, oxide content, hydrophobicity, film stress and plasma etching characteristics. Oxygen providing gases include, but are not limited to air, ozone, oxygen, nitrous oxide and nitric oxide. The third layer (e.g., the hard coating) may be formed as described in U.S. Patent Application Publication No. 2002/0173172 A1, the entire content of which is incorporated herein by reference.

In some embodiments, the third layer (e.g., the hard coating) may be formed from a mixture of SiH$_4$ and NH$_3$, or a mixture of oxygen and hexamethyldisilizane, hexamethyldisiloxane, tetramethylcyclotetrasiloxane and/or octamethylcyclotetrasiloxane. At least a portion of the reactive gas may be dissociated outside of the discharge cavity. Fragments generated from the reactive gas by the plasma may react to form the third layer (e.g., the hard coating). The ratio of NH$_3$:SiH$_4$ may be 0.5 to 1. As the amount of ammonia is increased, the Si—N bond density in the third layer (e.g., the hard coating) may increase. The remaining deposition conditions should be readily apparent to those of ordinary skill in the art.

A hydrogenated silicon oxycarbide (H:SiOC) film of the third layer (e.g., the hard coating) may be formed as disclosed in U.S. Pat. No. 6,159,871, the entire content of which is incorporated by reference. For example, the hydrogenated silicon oxycarbide may be formed from a reactive gas mixture including a methyl-containing silane and an oxygen providing gas, but the present disclosure is not limited thereto. Non-limiting examples of the methyl-containing silane include methylsilane (CH$_3$SiH$_3$), dimethylsilane ((CH$_3$)$_2$SiH$_2$), trimethylsilane ((CH$_3$)$_3$SiH), and tetramethyl silane ((CH$_3$)$_4$Si). The third layer (e.g., the hard coating) may be formed using any other suitable process available for forming a hard coating. For example, the third layer (e.g., the hard coating) may be formed as described in U.S. Reissue Pat. No. RE37,294, U.S. Pat. Nos. 6,504,294, 6,086,962, 6,077,569, 5,973,447, 5,846,649, 5,679,413, 5,618,619, 5,508,368, 5,888,593, U.S. Pat. App. Pub. No. 2008/0280060, U.S. Pat. No. 8,203,103, U.S. Pat. App. Pub. No. 2007/0196633, U.S. Pat. Nos. 8,603,592, 7,878,054, 8,313,812, and U.S. Pat. App. Pub. No. 2014/0065395, the entire content of each of which is incorporated herein by reference. Any suitable plasma source may be used. For example, any suitable plasma source described in EP 1 554 412 B1, the entire content of which is incorporated herein by reference, may be used. In some embodiments, the third layer (e.g., the hard coating) is formed using a gridless ion source. For example, a diamond-like carbon (DLC) film (e.g., a DLC film as described in U.S. Pat. No. 5,973,447, the entire content of which is incorporated herein by reference and/or a DIAMONDSHIELD® layer available from Diamonex, Inc.), may be used. The third layer (e.g., the hard coating) may be formed using the gridless ion source and the reactive gas described above with respect to the deposition performed using the dual plasma beam source. The remaining deposition conditions should be readily apparent to those of ordinary skill in the art.

The second layer (e.g., the hard basecoat) may be configured to provide suitable (or sufficient) hardness (e.g., a hardness of 0.45 (or greater than 0.45) to less than or equal to 0.75 GPa) to support the third layer (e.g., the hard coating) and reduce an amount or likelihood of cracking, crazing, or flaking of the third layer (e.g., the hard coating). For example, if the hardness of the second layer is too low (e.g., less than 0.45 GPa), the third layer may flex too much during formation resulting in cracking, crazing, and/or flaking of the third layer. The second layer (e.g., the hard basecoat) and the third layer (e.g., the hard coating) may be configured to provide improved adhesion between the second layer (e.g., the hard basecoat) and the third layer (e.g., the hard coating), thereby improving the mechanical and environmental durability of the coated substrate. The second layer (e.g., the hard basecoat) may include a polymer including any suitable polysiloxane, acrylic, polyurethane, epoxy, copolymer thereof, or mixture thereof. For example, the polysiloxane may include any suitable organo-silicon polymer. The second layer may include any acrylic, epoxy, polyurethane, copolymer thereof or mixture thereof as described with respect to the first layer, provided that the second layer has a suitable hardness as described herein. The second layer may further include a UV absorber and/or UV stabilizer, such as any of those described with respect to the first layer. In some embodiments, the second layer is free or substantially free of the UV absorber and/or UV stabilizer. As used herein, the term "substantially free of the UV absorber and/or UV stabilizer" means that the UV absorber and/or UV stabilizer is present in the referenced layer, if at all, as an incidental impurity. The second layer (e.g., the hard basecoat) may improve the durability and lifetime of the coated substrate as a result of inorganic moieties present in the polysiloxane and the hardness of the polysiloxane. The second layer (e.g., the hard basecoat) may be formed from a polymeric and/or oligomeric silane, among other species, but the second layer (e.g., the hard basecoat) is not limited thereto. For example, a coating composition for forming the polysiloxane may be prepared from a mixture (or combination) of a monomeric silane (e.g., tetraethoxysilane, methyl trimethoxysilane, and/or 3-glycidoxypropyltrimethoxysilane) and a silane terminated polymer that are hydrolyzed in a mixture of water and acid to form the corresponding silanols. The silanols then react by a condensation reaction mechanism to form water and siloxane linkages. The liquid coating composition formed at this stage includes precondensates which are solvated by polar solvents such as isopropanol and butanol included in the coating composition. When the liquid coating composition is applied onto a surface and cured, the silanols of the precondensate react further to form the polysiloxane layer (e.g., the second layer or hard basecoat).

The second layer (e.g., the hard basecoat) may be formed by any suitable process, such as dip or flow coating or spraying. The process of forming the second layer (e.g., the hard basecoat) should be readily apparent to those of ordinary skill in the art. The second layer (e.g., the hard basecoat) may have a thickness of 0.5 to 5 µm, but the second layer (e.g., the hard basecoat) is not limited thereto. For example, the second layer (e.g., the hard basecoat) may have a thickness of 2 to 5 µm, or 4 µm.

The substrate may include any suitable substrate (e.g., any suitable transparent substrate). For example, the substrate may include polycarbonate, acrylic (e.g., stretched acrylic), OPTICOR (available from PPG Industries Inc.), and/or the like. OPTICOR is a trademark of PPG Industries Inc. The substrate may include any suitable polyurethane set forth in U.S. Patent Application Publication No. 2009/0280329 A1, the entire content of which is incorporated herein by reference. The substrate may have a thickness of 0.001 to 1 inch (25.4 µm to 25.4 mm). For example, the substrate may have a thickness of 0.2 to 0.5 inch (5.08 mm to 12.7 mm). The substrate may be sensitive to ultraviolet light and the UV absorber and/or UV stabilizer of the first layer (e.g., the soft layer) may reduce UV degradation of the substrate that would otherwise occur without the presence of the UV absorber and/or UV stabilizer in the first layer (e.g., the soft layer).

Figure 2:
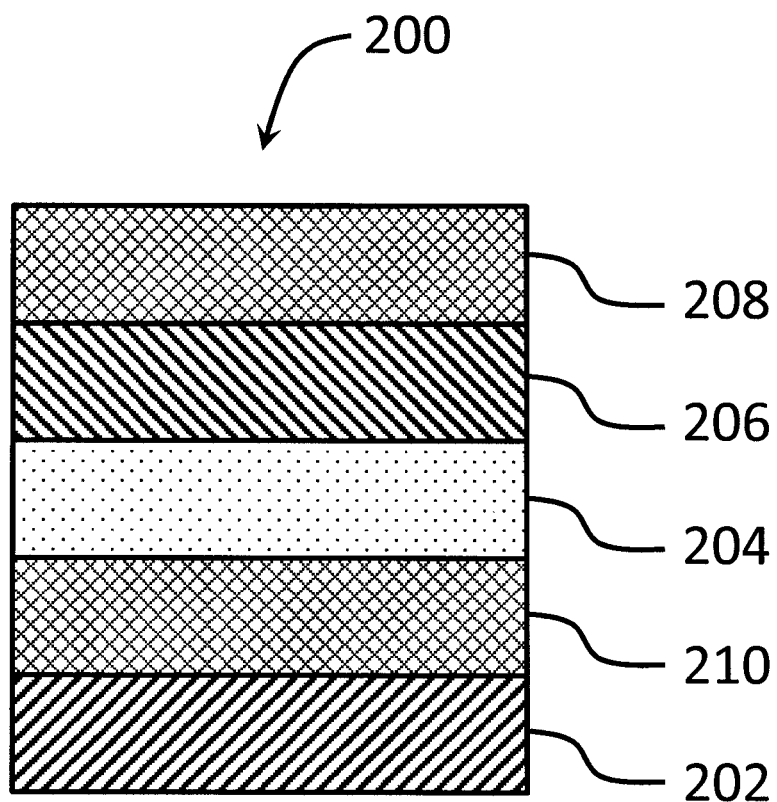
FIG. 2 is a schematic cross-sectional view of a coated substrate according to an embodiment of the present disclosure.
Figure 3:
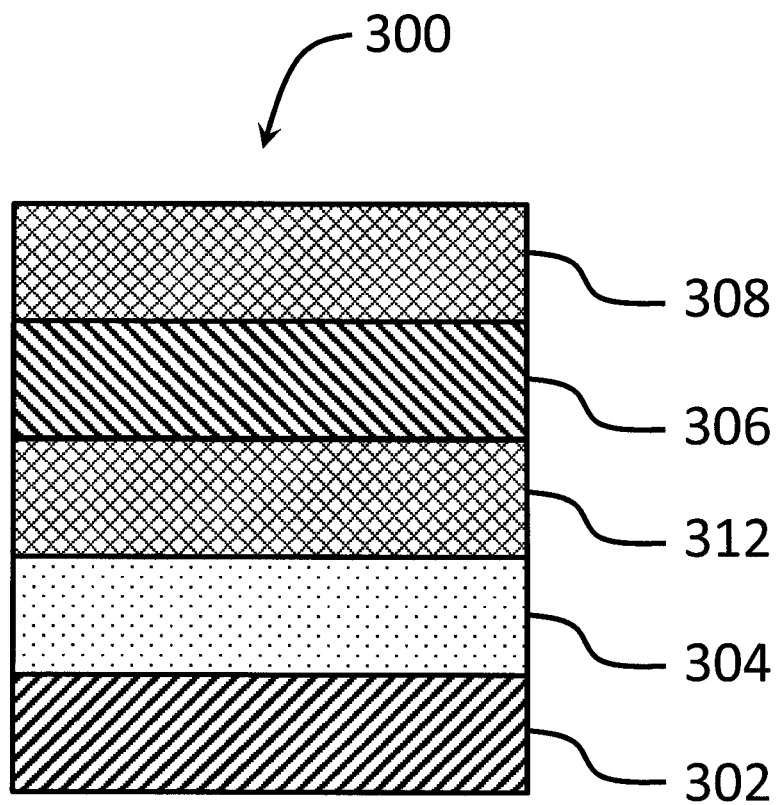
FIG. 3 is a schematic cross-sectional view of a coated substrate according to an embodiment of the present disclosure.

The coated substrate may further include an adhesion promoting coating. For example, in the embodiment shown in FIG. 2, a coated substrate 200 includes an adhesion promoting coating 210 between a substrate 202 and a first layer 204 (e.g., a soft layer). The coated substrate 200 further includes a second layer 206 (e.g., a hard basecoat) on at least a portion of the first layer 204 (e.g., the soft layer) and a third layer 208 (e.g., a hard coating) on at least a portion of the second layer 206 (e.g., the hard basecoat). The adhesion promoting coating, however, is not limited thereto. For example, in the embodiment shown in FIG. 3, a coated substrate 300 includes an adhesion promoting coating 312 between a first layer 304 (e.g., a soft layer) and a second layer 306 (e.g., a hard basecoat). The first layer 304 (e.g., the soft layer) is on at least a portion of a substrate 302 and a third layer 308 (e.g., a hard coating) is on at least a portion of the second layer 306 (e.g., the hard basecoat).

Figure 4:
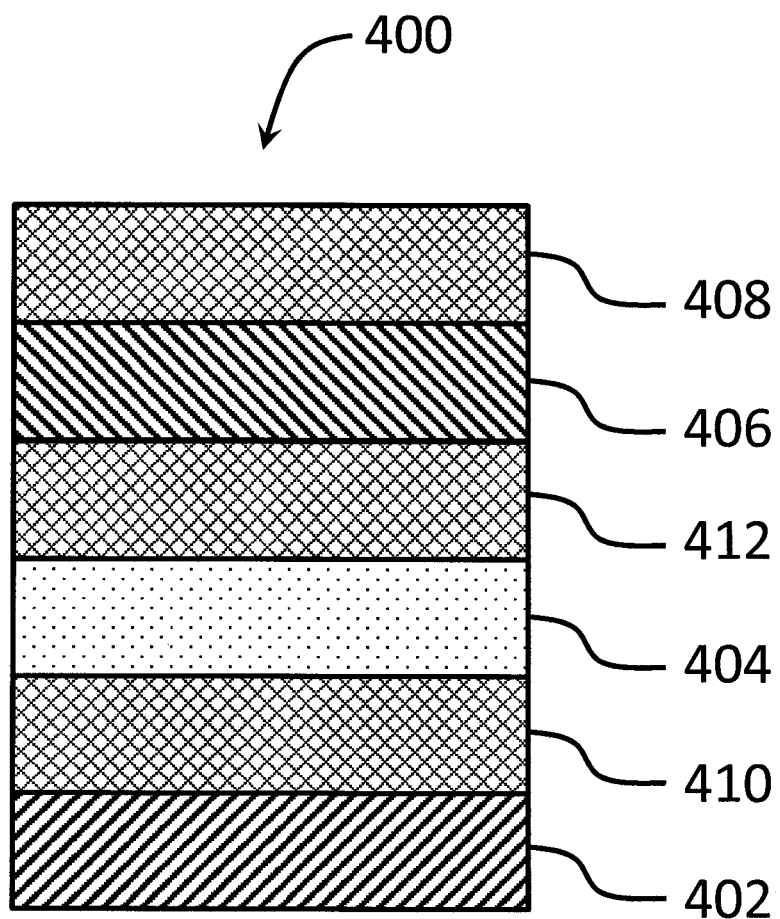
FIG. 4 is a schematic cross-sectional view of a coated substrate according to an embodiment of the present disclosure.

Embodiments of the coated substrate may include an adhesion promoting coating between any or all of the layers described herein. In some embodiments, for example, as shown in FIG. 4, a coated substrate 400 includes an adhesion promoting coating (e.g., a first adhesion promoting coating) 410 on at least a portion of a substrate 402, and a first layer 404 (e.g., a soft layer) on at least a portion of the adhesion promoting coating 410. In addition to the adhesion promoting coating 410, the coated substrate 400 further includes an adhesion promoting coating (e.g., a second adhesion promoting coating) 412 on at least a portion of the first layer 404 (e.g., the soft layer). The coated substrate 400 further includes a second layer 406 (e.g., a hard basecoat) on at least a portion of the adhesion promoting coating 412, and a third layer 408 (e.g., a hard coating) on at least a portion of the second layer 406 (e.g., the hard basecoat). The coated substrate may further include an adhesion promoting coating between the second layer and the third layer. In FIGS. 2-5, the substrate, first layer (e.g., soft layer), second layer (e.g., hard basecoat) and third layer (e.g., hard coating) are the same as those described above with respect to FIG. 1.

The adhesion promoting coating may include any suitable silane (e.g., a silane polymer and/or a silane coupling agent). Examples of silane coupling agents include 3-aminopropyltrimethoxysilane, 2-aminoethyl-3-aminopropyltriethoxysilane, 3-glycidoxypropyltrimethoxysilane, and/or 3-methacryoxypropyltrimethoxysilane, but the silane coupling agent is not limited thereto. The silane coupling agent may be included in a solution (or mixture) in an amount of 0.2 wt % to 5 wt %, based on the total amount of the solution (or mixture). The prehydrolyzed form of the silane coupling agent can be used as a primer for promoting adhesion and increasing surface energy for better wetting and surface flow properties (which may improve cosmetics and/or aesthetics) of the organic coating that is applied onto the primed surface. The adhesion promoting coating may have a thickness of 5 to 200 nm, 10 to 200 nm, or 50 to 200 nm. The adhesion promoting coating may be formed by any suitable method available in the art. For example, the adhesion promoting coating may be applied by wipe on/off or flow coating techniques. The adhesion promoting coating may be thermal or UV cured, but curing is not required. For example, the adhesion promoting coating may be formed by drying at ambient conditions for a period of 15 to 30 minutes without thermal or UV curing.

Figure 5:
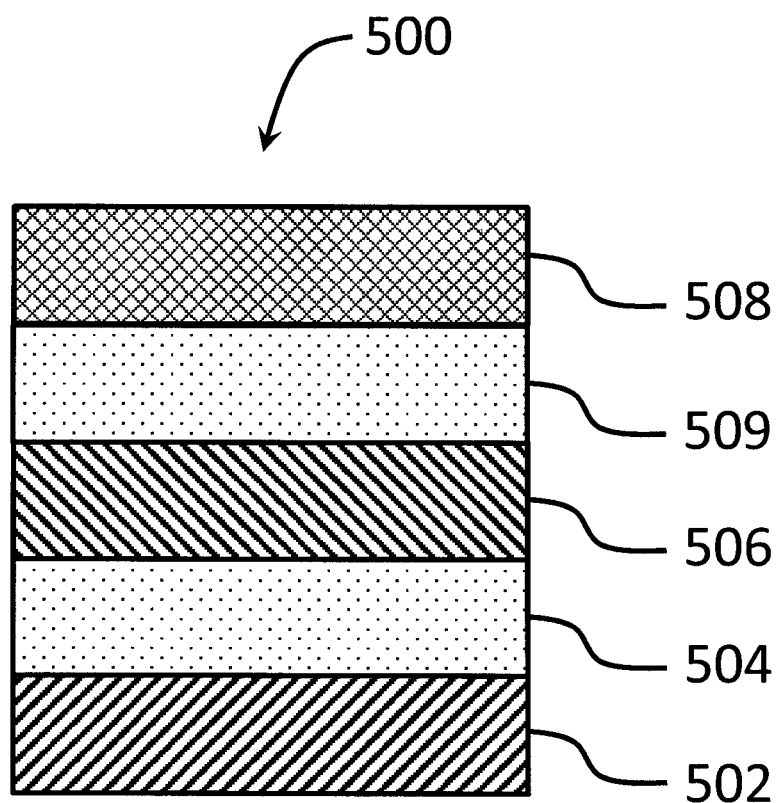
FIG. 5 is a schematic cross-sectional view of a coated substrate according to an embodiment of the present disclosure.

According to embodiments of the present disclosure, the coated substrate may further include a fourth layer between the second layer and the third layer. For example, as shown in FIG. 5, a coated substrate 500 includes a first layer 504 on at least a portion of a substrate 502, a second layer 506 on at least a portion of the first layer, a fourth layer 509 on at least a portion of the second layer, and a third layer 508 on at least a portion of the fourth layer, where the second layer has a hardness higher than that of the first layer, the fourth layer has a hardness higher than that of the second layer, and the third layer has a hardness higher than that of the fourth layer. The coated substrate may further include an adhesion promoting coating between any of the respective layers. For example, the coated substrate may further include an adhesion promoting coating between the second layer and the fourth layer, and/or between the fourth layer and the third layer. The adhesion promoting coating may be the same as described with respect to the first and second layers. The fourth layer has a higher hardness than the second layer, which has a higher hardness than the first layer. The fourth layer may include a polymer including a polysiloxane, an epoxy, a copolymer thereof, or a mixture thereof. The polysiloxane and/or epoxy of the fourth layer may be any of those described with respect to the first and second layers. The fourth layer may include a UV absorber and/or a UV stabilizer, such as any of those described with respect to the first layer. In some embodiments, the fourth layer is free or substantially free of the UV absorber and/or UV stabilizer. As used herein, the term "substantially free of the UV absorber and/or UV stabilizer" means that the UV absorber and/or UV stabilizer is present in the referenced layer, if at all, as an incidental impurity. The fourth layer may have a hardness of greater than or equal to 0.75 to less than or equal to 1.0 GPa, greater than or equal to 0.75 to less than or equal to 0.95 GPa, greater than or equal to 0.75 to less than or equal to 0.9 GPa, greater than or equal to 0.75 to less than or equal to 0.85 GPa, greater than or equal to 0.75 to less than or equal to 0.8 GPa, greater than or equal to 0.8 to less than or equal to 1.0 GPa, greater than or equal to 0.85 to less than or equal to 1.0 GPa, greater than or equal to 0.9 to less than or equal to 1.0 GPa, or greater than or equal to 0.95 to less than or equal to 1.0 GPa.

In some embodiments, the coated substrate includes the first layer including an acrylic, the second layer on the first layer and including an acrylic, and the fourth layer on the second layer and including a polysiloxane. In some embodiments, the coated substrate includes the first layer including an acrylic, the second layer on the first layer and including a polysiloxane, and the fourth layer on the second layer and including a polysiloxane. In some embodiments, the coated substrate includes the first layer including a polyurethane, the second layer on the first layer and including a polyurethane, and the fourth layer on the second layer and including a polysiloxane. In some embodiments, the coated substrate includes the first layer including a polyurethane, the second layer on the first layer and including an acrylic, and the fourth layer on the second layer and including a polysiloxane. In some embodiments, the coated substrate includes the first layer including an acrylic, the second layer on the first layer and including a polyurethane, and the fourth layer on the second layer and including a polysiloxane. In each of the foregoing embodiments, the second layer is harder than the first layer, and the fourth layer is harder than the second layer.

The coated substrates disclosed herein may have good flexibility and thermal stability and may be suitable for many transparency applications, such as, for example, windows, windshields, canopies and the like of vehicles, or windows of structures (e.g., buildings). As used herein, the term "vehicle" is given its broadest meaning and includes all types of vehicles, such as but not limited to aircraft (e.g., airplanes), cars, trucks, buses, vans, heavy duty equipment, golf carts, motorcycles, bicycles, railroad cars and the like. For example, the vehicle may include aircraft, including, but not limited to, airplanes (e.g., large commercial passenger and freight airplanes), helicopters, rockets, and other spacecraft. As such, the coated substrate may be any number of vehicle parts or components, including, for example, an aircraft windshield, window and canopy. The flexibility of embodiments of the coated substrates disclosed herein may be well suited for large, curved transparencies that experience relatively larger forces (e.g., relatively larger flexing forces) than smaller and/or less curved transparencies.

Embodiments of the present disclosure are further described below with reference to the following examples. The examples, however, are not intended to limit the scope of the present disclosure.

Preparation Example 1

A first layer (e.g., a soft layer) including polyacrylate was formed on a 12 inch (304.8 mm) by 12 inch (304.8 mm) polycarbonate substrate having a thickness of 0.25 inch (6.35 mm) by flow coating a coating composition (FX-430, produced by PPG Industries, Inc., Pittsburg, Pa.) on the polycarbonate substrate. The resultant coating was air dried for 60 minutes under ambient conditions (room temperature and room pressure). The coating was then cured at 180° F. for 2 hours.

Preparation Example 2

A second layer (e.g., a hard basecoat) including polysiloxane was formed on the coated polycarbonate substrate prepared as described in Preparation Example 1 by abrading the first layer (polyacrylate coating) with 7000 micromesh sand paper to increase the surface area of the polyacrylate coating and improve adhesion of the second layer to the first layer. A silane coating composition (FX-419, produced by PPG Industries, Inc., Pittsburg, Pa.) was flow coated on the abraded first layer and air dried for 30 minutes under ambient conditions (room temperature and room pressure). The coating was then cured at 180° F. for 2 hours.

Example 1

A third layer (e.g., a hard coating) was formed on the coated polycarbonate substrate prepared as described in Preparation Example 2 by placing the coated substrate inside a deposition chamber and pumping the chamber down to a base pressure (vacuum) of $5 \times 10^{-6}$ Torr. The operating pressure during growth of the third layer (during deposition) was 1 to 7 mTorr. To form a hydrogenated silicon oxycarbide (H:SiOC) film as the third layer, a precursor including tetramethyldisiloxane (TMDSO) diluted (or mixed) with argon gas and oxygen gas was flowed into the chamber using an argon flow rate of 200 to 500 standard cubic centimeters per minute (sccm) and an oxygen flow rate of 1000 to 2000 sccm. The deposition was performed using a cathode available from General Plasma Inc. (GPi, Tuscon, Ariz.) and a deposition rate of 250 nm per minute. During the growth of the third layer, the substrate was moved relative to the cathode at a speed of 160 inches (4.064 m) per minute for a total of 20 loops (i.e., the coated substrate was moved back and forth relative to the cathode 20 times to complete 20 cycles of back and forth movement of the coated substrate relative to the cathode).

Example 2

A hard basecoat including polysiloxane was formed on a 12 inch (304.8 mm) by 12 inch (304.8 mm) acrylic substrate having a thickness of 0.25 inch (6.35 mm) by flow coating a silane coating composition (FX-419, produced by PPG Industries, Inc., Pittsburg, Pa.) on the acrylic substrate and air drying for 30 minutes under ambient conditions (room temperature and room pressure). The coating was then cured at 180° F. for 2 hours. The coated acrylic substrate was placed inside a deposition chamber and the chamber was pumped down to a base pressure (vacuum) of $5 \times 10^{-6}$ Torr. The operating pressure during growth of a hard coating (during deposition) was 1 to 7 mTorr. To form a hydrogenated silicon oxycarbide (H:SiOC) film as the hard coating, a precursor including tetramethyldisiloxane (TMDSO) diluted (or mixed) with argon gas and oxygen gas was flowed into the chamber using an argon flow rate of 200 to 500 standard cubic centimeters per minute (sccm) and an oxygen flow rate of 1000 to 2000 sccm. The deposition was performed using a cathode available from General Plasma Inc. (GPi, Tuscon, Ariz.) and a deposition rate of 250 nm per minute. During the growth of the third layer, the substrate was moved relative to the cathode at a speed of 160 inches (4.064 m) per minute for a total of 10-30 loops (i.e., the coated substrate was moved back and forth relative to the cathode 10-300 times to complete 10-30 cycles of back and forth movement of the coated substrate relative to the cathode).

Figure 6:
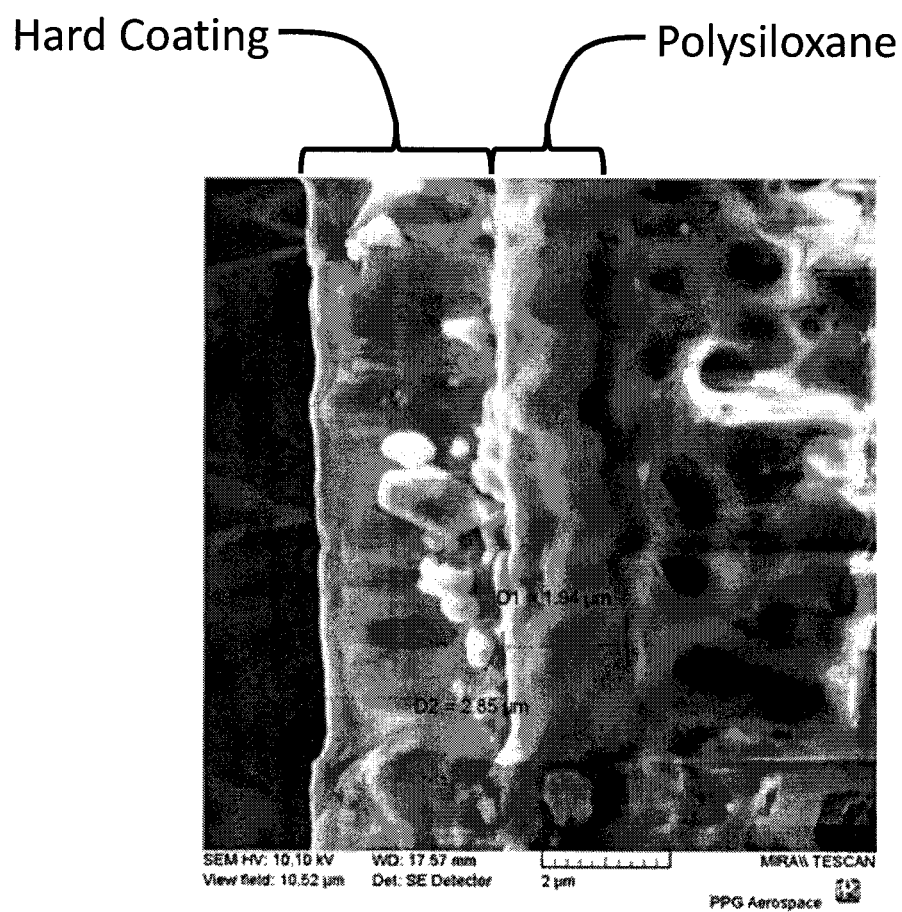
FIG. 6 is a scanning electron micrograph (SEM) image of a coated substrate according to an embodiment of the present disclosure.

A scanning electron micrograph (SEM) image of the coated substrate prepared as described in Example 2 is shown in FIG. 6. The elemental composition of the third layer (PECVD hard coating) prepared as described in Example 2 was measured by Rutherford Backscattering and Hydrogen Forward Scattering techniques. The third layer (PECVD hard coating) included hydrogenated silicon oxycarbide (H:SiOC) and was determined to have a composition of $H_{0.11}Si_{0.25}O_{0.50}C_{0.14}$.

Indentation Hardness

The hardness of each of the first layer prepared as described in Preparation Example 1, the second layer prepared as described in Preparation Example 2, the third layer prepared as described in Example 1, the coated substrate prepared as described in Example 2, and a glass (float glass available from GlassWerks LA Inc., Los Angeles, Calif.), and the modulus of each of the first layer prepared as described in Example 2, the glass, and the second layer prepared as described in Preparation Example 2, were measured using an MTS Nanoindenter XP (available from MTS Systems Corporation) using a Berkovich diamond tip having trigonal geometry. The measurements were made using an indentation depth of 4 μm, a strain rate of 0.05 s$^{-1}$, a harmonic displacement of 2 nm, a frequency of 45 Hz, and an assumed Poisson's ratio of 0.35. A depth of 0.2 to 0.3 μm was used for determining the mean values. The indentation hardness values obtained (in GPa) are shown in Table 1, which also includes the reported value for the hardness of DIAMONDSHIELD®. The modulus values obtained are shown in Table 2 in GPa.

TABLE 1

|  | Coating | Hardness (GPa) |
| --- | --- | --- |
| Preparation Example 1 | Polyacrylate | 0.29 |
| Preparation Example 2 | Polysiloxane | 0.6 |
| Example 1 | PECVD Hard Coating | 2.7-3.1 |
| Example 2 | Polyacrylate/ polysiloxane/PECVD Hard Coating | ~3 |
| DIAMONDSHIELD ® |  | 2-3 (reported at http://www.diamonex.com/products/diamondshield-coatings/) |
| Glass |  | 6.6 |

Figure 7:
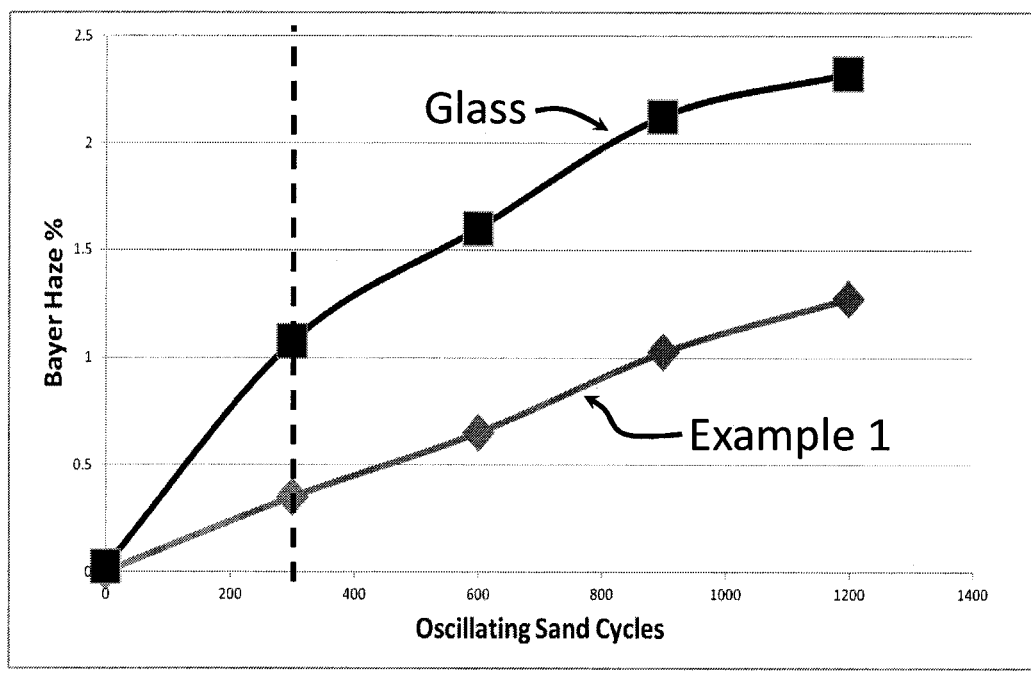
FIG. 7 is a graph showing coating sand abrasion resistance of an embodiment of the present disclosure prepared as described in Example 2 and of a comparative example including glass.

The abrasion resistance of the coated substrate prepared as described in Example 2, the above-identified glass, stretched acrylic, and the polysiloxane coating prepared as described in Preparation Example 2 were determined using ASTM F735-11 ("abrasion resistance using oscillating sand"). The haze of each abraded coupon was measured using a Haze-Gard Plus instrument. The results of the abrasion resistance using oscillating sand measurements for the coated substrate prepared as described in Example 2 relative to the above-identified glass are shown in FIG. 7. For comparison, after 300 cycles, the stretched acrylic exhibited a Bayer Haze % of 49%, and the polysiloxane of Preparation Example 2 exhibited a Bayer Haze % of 8.5%. In FIG. 7, the broken line indicates 300 cycles.

The abrasion resistance of the coated substrate prepared as described in Example 2, the glass, and the polysiloxane coating prepared as described in Preparation Example 2 were determined using ASTM D698-05(2010) ("falling sand abrasion resistance"). The haze of each abraded coupon was measured using a Haze-Gard Plus instrument. The results of the falling sand abrasion resistance measurements are shown in Table 2.

TABLE 2

| | Modulus (GPa) | Falling Sand Abrasion Haze (Δ%) 300 cycles |
|---|---|---|
| Example 2 | 14-20 | 14.4 |
| Glass | 75 | 25.3 |
| Preparation Example 2 | 6.0 | 29.4 |

A 1 inch (2.54 cm) by 12 inch (304.8 mm) coupon of a coated substrate prepared as described in Example 2 was mandrel tested according to ASTM D522. The coupon was mounted on a U shaped fixture (a mandrel) having the coating (i.e., the hard coating) facing up (i.e., facing away from the U shaped fixture). The coated substrate was slowly bent until the coated substrate conformed to the shape of the U shaped fixture or cracks were observed in the coating. If no cracks were observed in the coating, the coated substrate was placed on another U shaped fixture having a smaller radius than the first U shaped fixture, and the process was repeated. The process was repeated using U shaped fixtures having progressively smaller radii until cracks were observed in the coating. The results of the mandrel testing are shown in Table 3.

TABLE 3

| Mandrel Testing (ASTM D522) Sample | Tensile (% elongation) | Compression (% elongation) |
|---|---|---|
| Example 2 | <1.89% | <1.89% |

Whereas particular embodiments of the present disclosure have been described above for purposes of illustration, it will be understood by those skilled in the art that numerous variations of the details of the present disclosure may be made without departing from the invention as defined in the appended claims, and equivalents thereof. For example, although embodiments herein have been described in connection with "a" first layer, "an" adhesion promoting coating, and the like, one or more of these components or any of the other components recited may be used according to the present disclosure.

Although various embodiments of the present disclosure have been described in terms of "comprising" or "including," embodiments consisting essentially of or consisting of are also within the scope of the present disclosure. For example, while the present disclosure describes a coated substrate including a substrate, a first adhesion promoting coating, a first layer, a second adhesion promoting coating, a second layer and a third layer, a coated substrate consisting essentially of, or consisting of, the substrate, the first adhesion promoting coating, the first layer, the second adhesion promoting coating, the second layer and the third layer, is also within the scope of the present disclosure. In this context, "consisting essentially of" means that any additional components in the coated substrate will not materially affect the weatherability and durability of the coated substrate.

As used herein, unless otherwise expressly specified, all numbers such as those expressing values, ranges, amounts or percentages may be read as if prefaced by the word "about," even if the term does not expressly appear. Further, use of the terms "substantially," "about," and the like reflects the penumbra of variation associated with measurement, significant figures, and interchangeability, all as understood by a person having ordinary skill in the art to which this disclosure pertains. As used herein, the terms "substantially," "about," and similar terms are used as terms of approximation and not as terms of degree, and are intended to account for the inherent deviations in measured or calculated values that would be recognized by those of ordinary skill in the art. Plural encompasses singular and vice versa. Also, as used herein, the terms "plastic" and "polymer" may refer to prepolymers, oligomers, and both homopolymers and copolymers; the prefix "poly" refers to two or more. When ranges are given, any endpoints of those ranges and/or numbers within those ranges may be combined within the scope of the present disclosure. The terms "including" and like terms mean "including but not limited to." Similarly, as used herein, the terms "on," "applied on," and "formed on" mean on, applied on, or formed on, but not necessarily in contact with the surface. For example, a coating "formed on" a substrate does not preclude the presence of one or more other layers of the same or different composition located between the formed coating and the substrate.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Notwithstanding that the numerical ranges and parameters set forth herein may be approximations, numerical values set forth in the specific examples are reported as precisely as is practical. Any numerical value, however, inherently contains certain errors necessarily resulting from the standard variation found in their respective testing measurements. The word "comprising" and variations thereof as used in this description and in the claims do not limit the disclosure to exclude any variants or additions.

What is claimed is:

1. A coated substrate comprising:
    a substrate;
    a first layer on at least a portion of the substrate, the first layer comprising:
        a polymer selected from the group consisting of an acrylic, an epoxy, a copolymer thereof, and a mixture thereof, and
        an additive selected from the group consisting of an ultraviolet light (UV) absorber, a UV stabilizer, and a mixture thereof;
    a second layer on at least a portion of the first layer, the second layer having a hardness higher than that of the first layer; and
    a third layer on at least a portion of the second layer, the third layer having a hardness higher than that of the second layer,
    wherein the second layer comprises a polysiloxane polymer, a polyurethane polymer, an epoxy polymer, a copolymer thereof, or a mixture thereof, and
    wherein the third layer comprises a plasma enhanced chemical vapor deposited coating comprising hydrogenated silicon oxycarbide.

2. The coated substrate of claim 1, wherein the first layer comprises the UV absorber.

3. The coated substrate of claim 1, wherein the first layer comprises the UV stabilizer.

4. The coated substrate of claim 1, further comprising an adhesion promoting coating between the first layer and the substrate.

5. The coated substrate of claim 4, wherein the adhesion promoting coating comprises a silane polymer and/or a silane coupling agent.

6. The coated substrate of claim 1, further comprising an adhesion promoting coating between the first layer and the second layer.

7. The coated substrate of claim 6, wherein the adhesion promoting coating comprises a silane polymer and/or a silane coupling agent.

8. A method of forming a coating on a substrate, the method comprising:
   forming a first layer on at least a portion of the substrate, the first layer comprising:
      a polymer selected from the group consisting of an acrylic, an epoxy, a copolymer thereof, and a mixture thereof, and
      an additive selected from the group consisting of an ultraviolet light (UV) absorber, a UV stabilizer, and a mixture thereof;
   forming a second layer on at least portion of the first layer, the second layer having a hardness higher than that of the first layer; and
   forming a third layer by plasma enhanced chemical vapor deposition on at least a portion of the second layer, the third layer having a hardness higher than that of the second layer,
   wherein the second layer comprises a polysiloxane polymer, a polyurethane polymer, an epoxy polymer, a copolymer thereof, or a mixture thereof, and
   wherein the third layer comprises a plasma enhanced chemical vapor deposited coating comprising hydrogenated silicon oxycarbide.

9. The method of claim 8, wherein the first layer comprises the UV absorber.

10. The method of claim 8, wherein the first layer comprises the UV stabilizer.

11. The method of claim 8, further comprising forming an adhesion promoting coating on at least a portion of the substrate, wherein the forming of the first layer comprises forming the first layer on at least a portion of the adhesion promoting coating.

12. The method of claim 11, wherein the adhesion promoting coating comprises a silane polymer and/or a silane coupling agent.

13. The method of claim 8, further comprising forming an adhesion promoting coating on at least a portion of the first layer, wherein the forming of the second layer comprises forming the second layer on at least a portion of the adhesion promoting coating.

14. The method of claim 13, wherein the adhesion promoting coating comprises a silane polymer and/or a silane coupling agent.

* * * * *